(12) United States Patent
Diaz et al.

(10) Patent No.: US 11,908,922 B2
(45) Date of Patent: Feb. 20, 2024

(54) HETEROGENEOUS SEMICONDUCTOR DEVICE SUBSTRATES WITH HIGH QUALITY EPITAXY

(71) Applicant: TAIWAN SEMICONDUCTOR MANUFACTURING CO., LTD., Hsinchu (TW)

(72) Inventors: Carlos H. Diaz, Los Altos Hills, CA (US); Mark Van Dal, Linden (BE); Martin Christopher Holland, Bertem (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/080,613

(22) Filed: Oct. 26, 2020

(65) Prior Publication Data

US 2021/0057547 A1 Feb. 25, 2021

Related U.S. Application Data

(63) Continuation of application No. 16/010,425, filed on Jun. 16, 2018, now Pat. No. 10,818,778.

(Continued)

(51) Int. Cl.
*H01L 29/66* (2006.01)
*H01L 21/306* (2006.01)
(Continued)

(52) U.S. Cl.
CPC .... *H01L 29/66636* (2013.01); *H01L 21/0243* (2013.01); *H01L 21/0245* (2013.01);
(Continued)

(58) Field of Classification Search
CPC ............ H01L 29/66636; H01L 29/045; H01L 29/0649; H01L 29/0684; H01L 29/7848;
(Continued)

(56) References Cited

U.S. PATENT DOCUMENTS 6,704,070 B2 3/2004 Taniguchi
6,972,478 B1 12/2005 Waite
(Continued)

OTHER PUBLICATIONS

Currie, M.T., et al., "Controlling threading dislocation densities in Ge on Si using graded SiGe layers and chemical-mechanical polishing," Applied Physics Letters, vol. 72, No. 14, pp. 1-4 (Apr. 6, 1998).

(Continued)

*Primary Examiner* — Igwe U Anya
(74) *Attorney, Agent, or Firm* — Maschoff Brennan

(57) ABSTRACT

A semiconductor structure includes a substrate, a first epitaxial layer, a second epitaxial layer, and a transistor. The substrate includes a first pyramid protrusion, a second pyramid protrusion, a third pyramid protrusion, and a fourth pyramid protrusion. The first and second pyramid protrusions are arranged along a first direction, the second and fourth pyramid protrusions are arranged along the first direction, and the first and third pyramid protrusions are arranged along a second direction crossing the first direction. The first epitaxial layer is over the substrate and in contact with the first, second, third, and fourth pyramid protrusions. The second epitaxial layer is over the first epitaxial layer. The transistor is over the second epitaxial layer.

20 Claims, 16 Drawing Sheets

Related U.S. Application Data

(60) Provisional application No. 62/591,086, filed on Nov. 27, 2017.

(51) Int. Cl.
*H01L 29/04* (2006.01)
*H01L 21/02* (2006.01)
*H01L 29/06* (2006.01)
*H01L 29/78* (2006.01)
*H01L 21/308* (2006.01)
*H01L 21/265* (2006.01)
*H01L 29/167* (2006.01)

(52) U.S. Cl.
CPC .. *H01L 21/02381* (2013.01); *H01L 21/02433* (2013.01); *H01L 21/02538* (2013.01); *H01L 21/02639* (2013.01); *H01L 21/02658* (2013.01); *H01L 21/3083* (2013.01); *H01L 21/30604* (2013.01); *H01L 21/30608* (2013.01); *H01L 29/045* (2013.01); *H01L 29/0649* (2013.01); *H01L 29/0684* (2013.01); *H01L 29/7848* (2013.01); *H01L 21/26513* (2013.01); *H01L 29/167* (2013.01)

(58) Field of Classification Search
CPC ............. H01L 29/167; H01L 21/02381; H01L 21/0243; H01L 21/02433; H01L 21/0245; H01L 21/02538; H01L 21/02639; H01L 21/02658; H01L 21/30604; H01L 21/30608; H01L 21/3083; H01L 21/26513
USPC ........................................................ 257/506
See application file for complete search history.

(56) References Cited

U.S. PATENT DOCUMENTS

| | | | |
|---|---|---|---|
| 7,172,957 B2 * | 2/2007 | Namba | H01L 21/02433 438/607 |
| 8,679,885 B1 | 3/2014 | Cheng | |
| 9,461,112 B1 | 10/2016 | Lee | |
| 9,608,160 B1 | 3/2017 | Bayram | |
| 10,027,086 B2 | 7/2018 | Bayram | |
| 2002/0074561 A1 | 6/2002 | Sawaki | |
| 2002/0081825 A1 | 6/2002 | Williams | |
| 2002/0086542 A1 | 7/2002 | Shepard | |
| 2003/0119239 A1 * | 6/2003 | Koike | H01L 21/02647 438/200 |
| 2006/0169987 A1 | 8/2006 | Miura | |
| 2006/0289386 A1 * | 12/2006 | Tysoe | H01L 21/31111 73/705 |
| 2007/0205407 A1 * | 9/2007 | Matsuo | H01L 29/7787 257/13 |
| 2009/0149009 A1 | 6/2009 | Tischler | |
| 2011/0049681 A1 * | 3/2011 | Vielemeyer | H01L 21/02433 257/627 |
| 2011/0095327 A1 * | 4/2011 | Shinohara | H01L 33/16 257/E33.028 |
| 2012/0161151 A1 * | 6/2012 | Rana | H01L 21/02658 257/E33.028 |
| 2012/0241719 A1 * | 9/2012 | Lee | H01L 33/20 257/E33.068 |
| 2012/0299015 A1 * | 11/2012 | Tachibana | H01L 33/20 257/79 |
| 2013/0161652 A1 * | 6/2013 | Lin | H01L 33/22 438/22 |
| 2015/0108247 A1 | 4/2015 | Aten | |
| 2015/0206796 A1 | 7/2015 | Dasgupta | |
| 2016/0064606 A1 * | 3/2016 | Chiu | H01L 21/02502 438/479 |
| 2017/0310076 A1 | 10/2017 | Bayram | |
| 2018/0108697 A1 | 4/2018 | Matsugai | |

OTHER PUBLICATIONS

Hines, M.A., "In Search of Perfection: Understanding the Highly Defect-Selective Chemistry of Anisotropic Etching," Anisotropic Silicon Etching, vol. 54, pp. 29-56 (Dec. 2, 2002).

Kendall, D.L., "Vertical Etching of Silicon at Very High Aspect Ratios," Vertical Etching, vol. 9, pp. 373-404 (1979).

Merckling, C., et al., "Heteroepitaxy of InP on Si(001) by selective-area metal organic vapor-phase epitaxy in sub-50 nm width trenches: The role of the nucleation layer and the recess engineering," Journal of Applied Physics, vol. 115, pp. 1-7 (2014).

Nayfeh, A., et al., "Effects of hydrogen annealing on heteroepitaxial-Ge layers on Si: Surface roughness and electrical quality," Applied Physics Letters, vol. 85, No. 14, pp. 1-4 (Oct. 4, 2004).

Sato, K., et al. "Characterization of orientation-dependent etching properties of single-crystal silicon: effects of KOH concentration," Sensors and Actuators, vol. 64, pp. 87-93 (1998).

Schnakenberg, U., et al., "TMAHW Etchants for Silicon Micromachining," IEEE, pp. 815-818 (1991).

Seidel, A., et al., "Anisotropic Etching of Crystalline Silicon in Alkaline Solutions," The Electrochemical Society, vol. 137, No. 11, pp. 3626-3632 (Nov. 1990).

Sekimura, M., et al., "Anisotropic Etching of Surfactant-Added TMAH Solution," IEEE, pp. 650-655 (1990).

Shikida, M., et al., "Differences in anisotropic etching properties of KOH and TMAH solutions," Sensors and Actuators, vol. 80, pp. 179-188 (2000).

Tabata, O., et al., "Anisotropic etching of silicon in TMAH solutions," Sensors and Actuators, vol. 34, pp. 51-57 (1992).

"Wet-Chemical Etching and Cleaning of Silicon," pp. 1-11 (Jan. 2003).

* cited by examiner

HETEROGENEOUS SEMICONDUCTOR DEVICE SUBSTRATES WITH HIGH QUALITY EPITAXY

PRIORITY CLAIM AND CROSS-REFERENCE

The present application is a continuation of the U.S. patent application Ser. No. 16/010,425, filed Jun. 16, 2018, now U.S. Pat. No. 10,818,778, issued Oct. 27, 2020, which claims priority to U.S. Provisional Application Ser. No. 62/591,086, filed Nov. 27, 2017, which is herein incorporated by reference.

BACKGROUND

Besides the possible implementation of germanium or III-V compounds for optoelectronics, which is high speed and high efficiency photodetectors, or high speed thin film transistors, the main thrust for heterogeneous epitaxy on silicon wafer has been the potential of germanium and III-V compounds to replace silicon as channel for future CMOS nodes. Techniques that involve heterogeneous epitaxy directly on silicon, for example, a strain-relax-buffer, lead to defect densities larger than $10^4/cm^2$.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
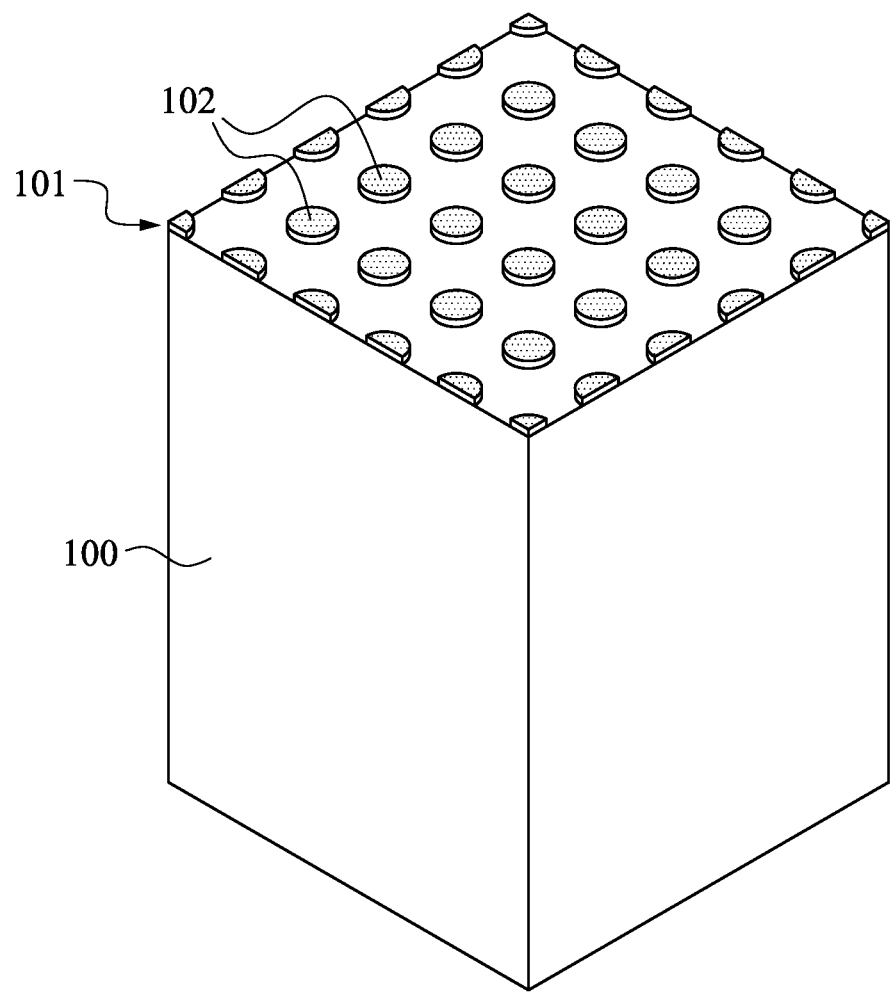
FIG. 1 is a perspective view of a portion of a semiconductor structure in an intermediate stage of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the structure in use or operation in addition to the orientation depicted in the figures. The apparatus may be otherwise oriented (rotated 90 degrees or at other orientations) and the spatially relative descriptors used herein may likewise be interpreted accordingly.

Figure 2:
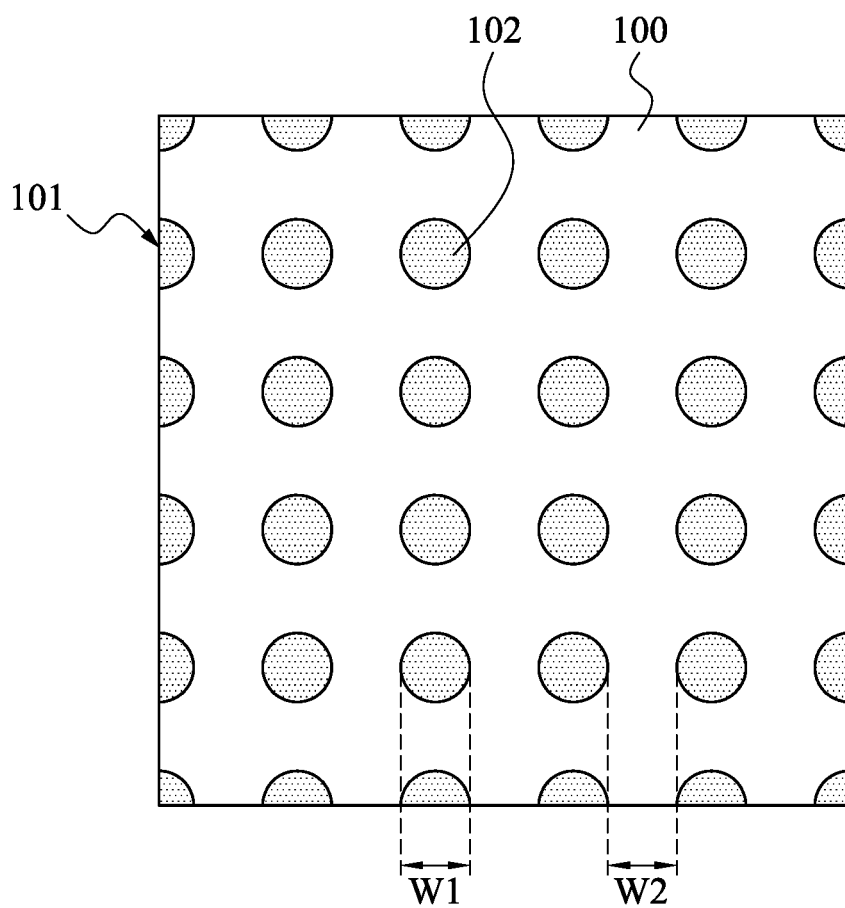
FIG. 2 is a top view of a portion of a semiconductor structure in an intermediate stage of fabrication in accordance with some embodiments of the present disclosure.

FIG. 1 is a perspective view of a semiconductor structure at various stages in accordance with some embodiments of the present disclosure. FIG. 2 is a top view of FIG. 1 in accordance with some embodiments of the present disclosure. As illustrated, silicon substrate 100 is provided. In some embodiments, the silicon substrate 100 is a (100) substrate having a (100) surface orientation, although it may have other surface orientations, such as (110). The silicon substrate 100 may be a bulk substrate, as shown in FIG. 1, or may be a silicon-on-insulator substrate having buried oxide (not shown). In some embodiments, the silicon substrate 100 is in a semiconductor chip or a portion of a wafer.

A mask layer 101 is formed on the silicon substrate 100 and patterned into a plurality of patterned mask portions 102, as shown in FIGS. 1 and 2. The mask layer 101 is formed of a dielectric material, such as silicon oxide, which may be a thermal oxide or deposited oxide. Alternatively, the mask layer 101 is formed of other materials such as silicon nitride, silicon oxynitride, aluminum oxide, the like, or combinations thereof.

In some embodiments, the patterned mask portions 102 have a repeated pattern. The silicon substrate 100 is exposed through openings between the patterned mask portions 102. The patterned mask portions 102 are arranged in rows and columns. The patterned mask portions 102 with the periodical pattern advantageously define the boundaries of the subsequently formed silicon pyramids, and hence the sizes and the pattern densities of the silicon pyramids are more uniform. As shown in FIG. 2, the patterned mask portions 102 are non-staggered. In some other embodiments, the patterned mask portions 102 may be staggered. In some embodiments, the patterned mask portions 102 are equally spaced. In some embodiments, the patterned mask portion 102 resembles a dot, and a diameter W1 of the dot-shaped mask portion 102 is substantially equal to a spacing W2 between the dot-shaped mask portions 102. The diameter of the dot-shaped mask portion 102 may determine a height of the subsequently formed silicon pyramid, and hence the diameter of the dot-shaped mask portion 102 may be controlled, for example, from about 10 nm to about 100 nm. In some embodiments, the width W1 of the dot-shaped mask portion 102 is in a range from about 5 nm to about 30 nm. In some embodiments, the width W1 of the dot-shaped mask portion 102 may be less than about 500 nm. If the width W1 of the dot-shaped mask portion 102 is greater than about 500 nm, the subsequently formed recesses and pyramids may have a large topography which may be undesirable for subsequent epitaxy processes. In other embodiments, the width W1 of the dot-shaped mask portion 102 is in a range from about 5 nm to about 15 nm. It is realized, however, that the dimensions recited throughout the context are merely examples, and different dimensions may also be used. Moreover, the dot-shaped shape of the mask portions 102 are merely examples as well, and in other embodiments, the shape of the patterned mask portion 102 may include, but not limited to, square, rectangular or oval.

Figure 3:
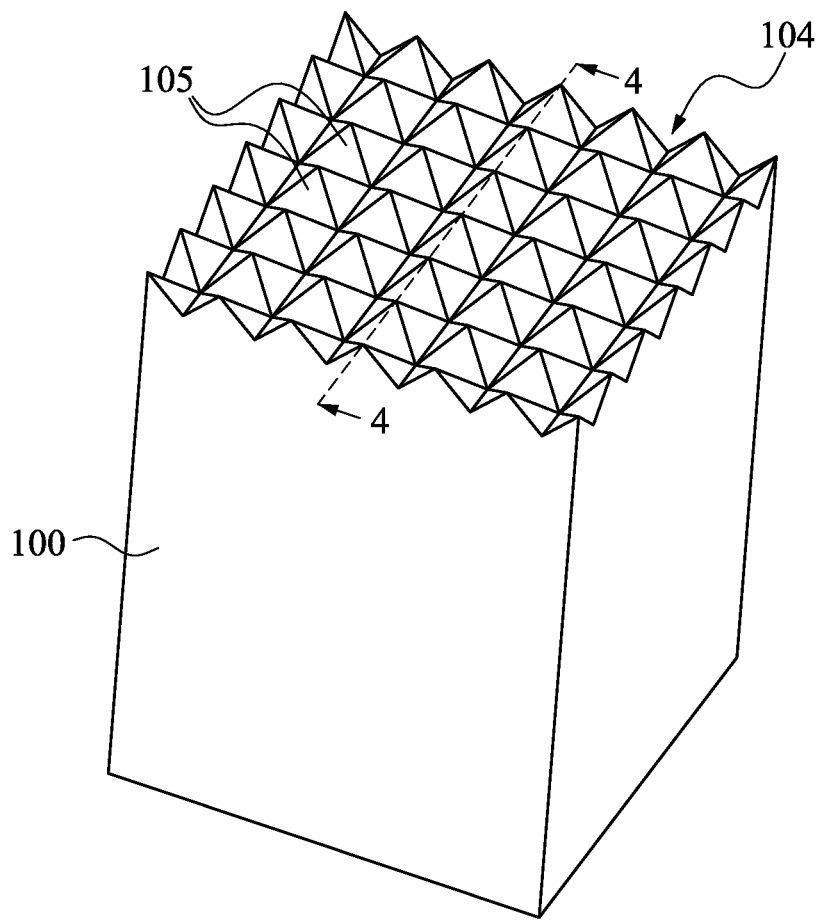
FIG. 3 is a perspective view of a portion of a semiconductor structure in an intermediate stage of fabrication in accordance with some embodiments of the present disclosure.
Figure 4:
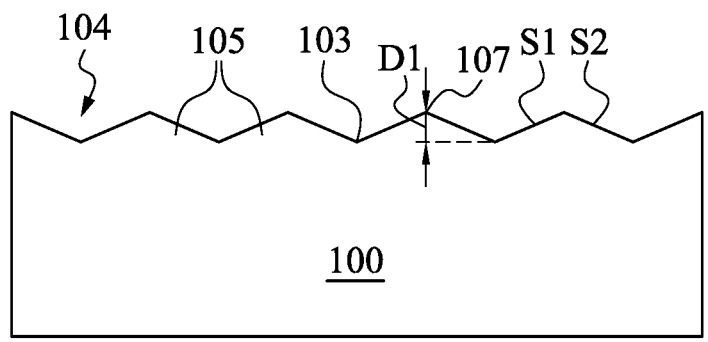
FIG. 4 is a cross-sectional view of a portion of a semiconductor structure in an intermediate stage of fabrication in accordance with some embodiments of the present disclosure.

Next, portions of the silicon substrate 100 are etched to form silicon pyramids 105 using the patterned mask layer 101 as an etch mask. The silicon pyramids 105 are separated by corresponding recesses 104. In some embodiments, the etching process also removes the patterned mask layer 101 if the patterned mask layer 101 is made of silicon oxide. In some other embodiments, an additional etching process is used to remove the patterned mask layer 101. The resulting structure is shown in FIGS. 3 and 4, wherein FIG. 3 is a perspective view, while FIG. 4 is a cross-sectional view taken along line 4-4. In some embodiments, the etching of the silicon substrate 100 may be, for example, anisotropic wet etching.

The anisotropic wet etching may use a potassium hydroxide (KOH)-based solution, a tetramethylammonium hydroxide (TMAH)-based solution, the like, or combinations thereof. Potassium hydroxide (KOH) and tetramethylammonium hydroxide (TMAH) display a higher etch rate in the (100) and (110) planes than in the (111) plane. For example, the etch rate ratio of (100) plane:(110) plane:(111) plane may satisfy: 1:0.5:0.01 in TMAH. The etch rate difference between the (100), (110) planes and the (111) plane results in pyramid structure as illustrated in FIG. 3. The pyramids 105 each have a V-shaped cross-sectional profile, as shown in FIG. 4. The sidewalls S1 and S2 of the pyramid 105 have a (111) crystal orientation. In some embodiments, the pyramid 105 has a height D1 that is a vertical distance from an apex (or peak) 107 to a valley 103 of the pyramid 105. In some embodiments, the height D1 of the pyramid 105 is from about 5 nm to about 80 nm, for example, about 10 nm to about 20 nm, such as 14 nm.

In some embodiments, the recesses 104 and corresponding pyramids 105 may be formed using potassium hydroxide (KOH) having from about 20% to about 40% volume percentage of KOH dissolved in water and in a temperature range from about 60° C. to about 80° C. In other embodiments, the recesses 104 and corresponding pyramids 105 may be formed using potassium hydroxide (KOH) having from about 40% to about 50% volume percentage of KOH dissolved in water and in a temperature range from about 110° C. to about 130° C.

In some other embodiments, the recesses 104 and corresponding pyramids 105 may be formed using Tetramethylammonium hydroxide (TMAH) having from about 15% to about 25% volume percentage of TMAH dissolved in water and in a temperature range from about 75° C. to about 85° C. In some other embodiments, the recesses 104 and corresponding pyramids 105 may be formed using TMAH having from about 3% to about 7% volume percentage of KOH dissolved in water and in a temperature range from about 85° C. to about 95° C. In some other embodiments, the recesses 104 and corresponding pyramids 105 may be formed using TMAH having from about 20% to about 25% volume percentage of KOH dissolved in water and in a temperature range from about 85° C. to about 95° C.

Figure 5:
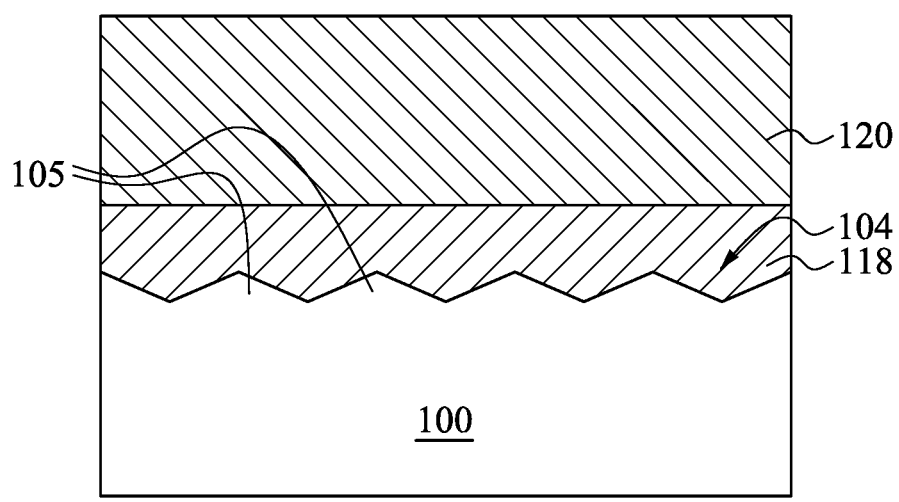
FIG. 5 is a cross-sectional view of a portion of a semiconductor structure in an intermediate stage of fabrication in accordance with some embodiments of the present disclosure.

Reference is made to FIG. 5. A first epitaxial layer 118 is formed at least in the recesses 104, and a second epitaxial layer 120 is formed on the first epitaxial layer 118. The first epitaxial layer 118 and/or the second epitaxial layer 120 are made of a material or materials which have lattice mismatches to the substrate 100. In some embodiments, the first epitaxial layer 118 and/or the second epitaxial layer 120 are made of germanium. The lattice mismatch between germanium and silicon is about 4%. In other embodiments, the first epitaxial layer 118 and/or the second epitaxial layer 120 are made of an III-V compound or III-V compounds. The lattice mismatch between an III-V compound and silicon is in a range from about 8% to about 12%. Therefore, if the recesses 104 were absent from the substrate 100, the first epitaxial layer 118 and/or the second epitaxial layer 120 might have epitaxial defects due to the lattice mismatch between the first epitaxial layer 118 and the substrate 100. The epitaxial defects may be, for example, threading dislocations (TDs).

Since the first epitaxial layer 118 is formed in the recesses 104, the threading dislocations (TDs) in the first epitaxial layer 118 terminate at sidewalls of the recesses 104. That is to say, the recesses 104 can terminate the TDs in the first epitaxial layer 118. In other words, the TDs extending along different directions can be trapped in the recesses 104. The first and second epitaxial layer 118 and 120 may be formed by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHVCVD), molecular beam epitaxy (MBE), or atomic layer deposition (ALD). In some embodiments, chemical-mechanical polishing (CMP) may be used to planarize a top surface of the second epitaxial layer 120. After the second epitaxial layer 120 is formed, one or more process steps may be performed to form one or more components of active devices, such as n-channel metal-oxide-semiconductor field-effect transistors (n-channel MOSFETs), p-channel MOSFETs, planar MOSFETs, or fin field-effect transistors (finFETs), on the second epitaxial layer 120, as illustrated in FIG. 6.

Figure 6:
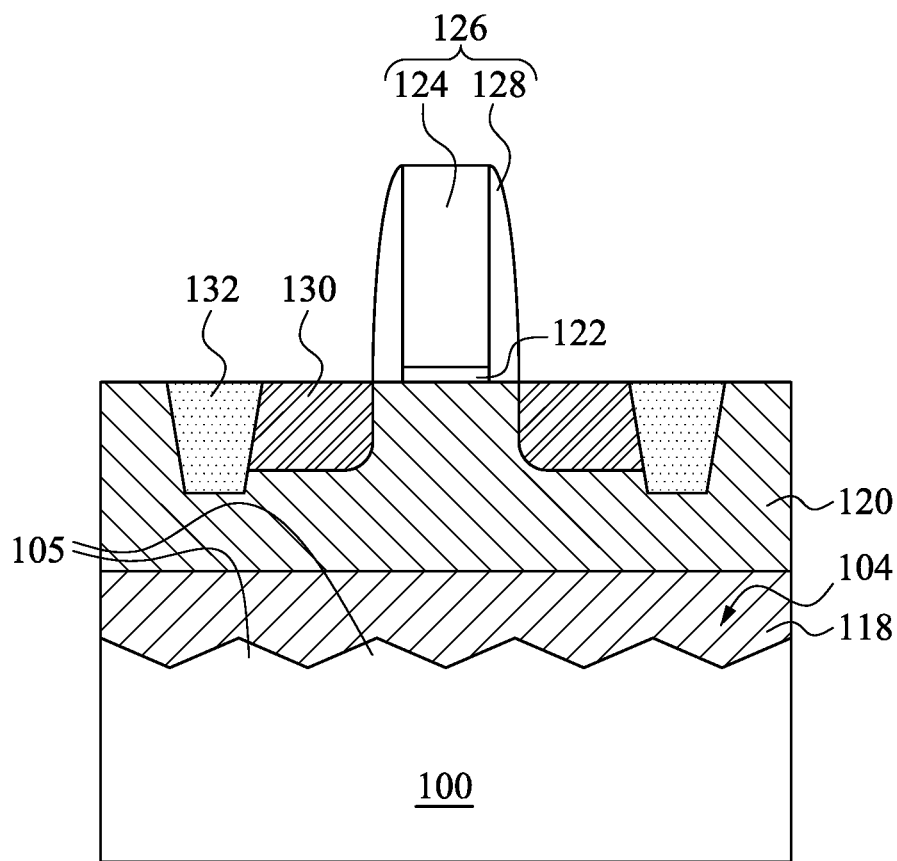
FIG. 6 is a cross-sectional view of a portion of a semiconductor structure in an intermediate stage of fabrication in accordance with some embodiments of the present disclosure.

FIG. 6 illustrates an exemplary transistor formed on the second epitaxial layer 120. The exemplary transistor includes a gate structure 126 and source/drain (S/D) regions 130 formed on opposite sides of the gate structure 126. The gate structure 126 is formed on the second epitaxial layer 120. In some embodiments, the gate structure 126 includes a gate dielectric layer 122 and a gate electrode layer 124 over the gate dielectric layer 122.

In some embodiments, the gate dielectric layer 122 includes a silicon oxide, silicon oxynitride, or high-k dielectric material. A high-k dielectric material is defined as a dielectric material with a dielectric constant greater than that of $SiO_2$, and the high-k dielectric material includes metal oxide. In some embodiments, the metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. In some embodiments, the gate dielectric layer 122 is formed by using a suitable process, such as a chemical vapor deposition (CVD) process or an atomic layer deposition (ALD) process. In some embodiments, the gate dielectric layer 122 further includes an interfacial layer (not illustrated) to minimize stress between the gate dielectric layer 122 and the second epitaxial layer 120. In some embodiments, the interfacial layer is formed of silicon oxide or silicon oxynitride grown by a thermal oxidation process. For example, the interfacial layer can be grown by a rapid thermal oxidation (RTO) process or in an annealing process comprising oxygen.

In some embodiments, the gate electrode layer 124 includes a single layer or multilayer structure. In some embodiments, the gate electrode layer 124 includes polysilicon. Furthermore, the gate electrode layer 124 may be doped poly-silicon with the uniform or gradient doping. In some embodiments, the gate electrode layer 124 is formed by using a low-pressure CVD (LPCVD) process. In some other embodiments, the gate electrode layer 124 is a metal gate.

In some embodiments, gate spacers 128 are formed on opposite sidewalls of the gate structure 126. The gate spacers 128 are formed of, for example, silicon oxide, silicon nitride, silicon oxynitride, silicon carbide, fluoride-doped silicate glass (FSG), a low k dielectric material, and/or combinations thereof. In some embodiments, at least one of the spacers 128 may have a multiple-layers structure, for example, including one or more liner layers.

In some embodiments, the source/drain (S/D) regions 130 are formed in the second epitaxial layer 120. In some embodiments, the S/D regions 130 in the second epitaxial layer 120 are laterally spaced apart from the gate structure 126 by the gate spacers 120. In some embodiments, the S/D regions 130 are formed by using an ion implantation. For example, an n-type dopant, such as phosphorous, or a p-type dopant, such as boron is doped into at least one portion of the second epitaxial layer 120 which is not covered by the spacers 128 and the gate structures 126, so as to form the S/D regions 130. In some embodiments, the S/D regions 130 are epitaxially grown on the second epitaxial layer 120, and the epi-grown S/D regions 130 can be in-situ doped with an n-type dopant or a p-type dopant.

In some embodiments, at least one the isolation region 132 is formed in the substrate 100 to isolate the various active regions of the second epitaxial layer 120. The isolation regions 132 may utilize isolation technology, such as local oxidation of silicon (LOCOS) or shallow trench isolation (STI) region, to define and electrically isolate the various active regions of the second epitaxial layer 120. The isolation regions 132 include silicon oxide, silicon nitride, silicon oxynitride, fluoride-doped silicate glass (FSG), a low-K dielectric material, other suitable materials, or combinations thereof.

Further processes are performed to form various features such as additional interlayer dielectric layers, contacts/vias, interconnect metal layers, and passivation layers, etc. In the foregoing embodiments, a planar FET is formed on the second epitaxial layer 120. This is merely an example, and other embodiments of the present disclosure include forming other devices such as FinFET devices, gate-all-around (GAA) devices, Omega-gate (a-gate) devices, or Pi-gate (H-gate) devices, on the second epitaxial layer 120. In addition, embodiments disclosed herein may be employed in the formation of P-type and/or N-type devices. One of ordinary skill may recognize other embodiments of semiconductor devices that may benefit from aspects of the present disclosure.

Figure 7:
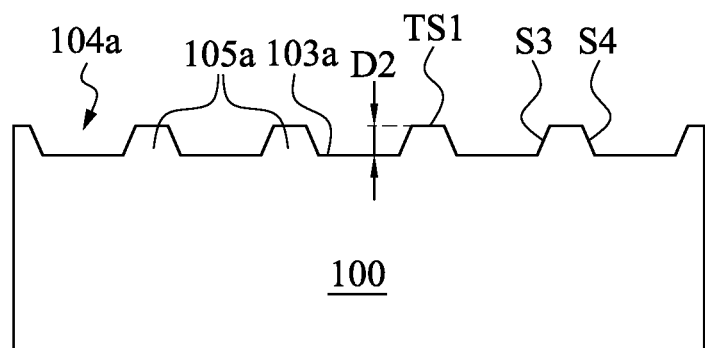
FIG. 7 is a cross-sectional view of a portion of a semiconductor structure in an intermediate stage of fabrication in accordance with some embodiments of the present disclosure.
Figure 8:
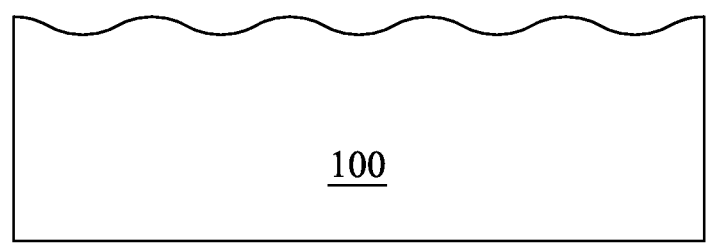
FIG. 8 is a cross-sectional view of a portion of a semiconductor structure in an intermediate stage of fabrication in accordance with another embodiment of the present disclosure.

In some other embodiments, top surfaces of the substrate 100 may not have V-shaped cross-sections. Further, the substrate 100 may be over-etched or under-etched, as illustrated in FIGS. 7 and 8. With reference to FIG. 7. The substrate 100 is under-etched, such that faces of the silicon pyramids 105a may have more than one crystal orientations. For example, top surface TS1 the silicon pyramid 105a has a (100) crystal orientation and sidewalls S3 and S4 of the silicon pyramid 105a have a (111) crystal orientation. In some embodiments, the recess 104a has a depth D2 in a range from about 2 nm to about 7 nm. Illustrated in FIG. 8 is a cross-sectional view of some embodiments of another semiconductor device after etching the substrate 100, which the substrate 100 is over-etched.

Figure 9:
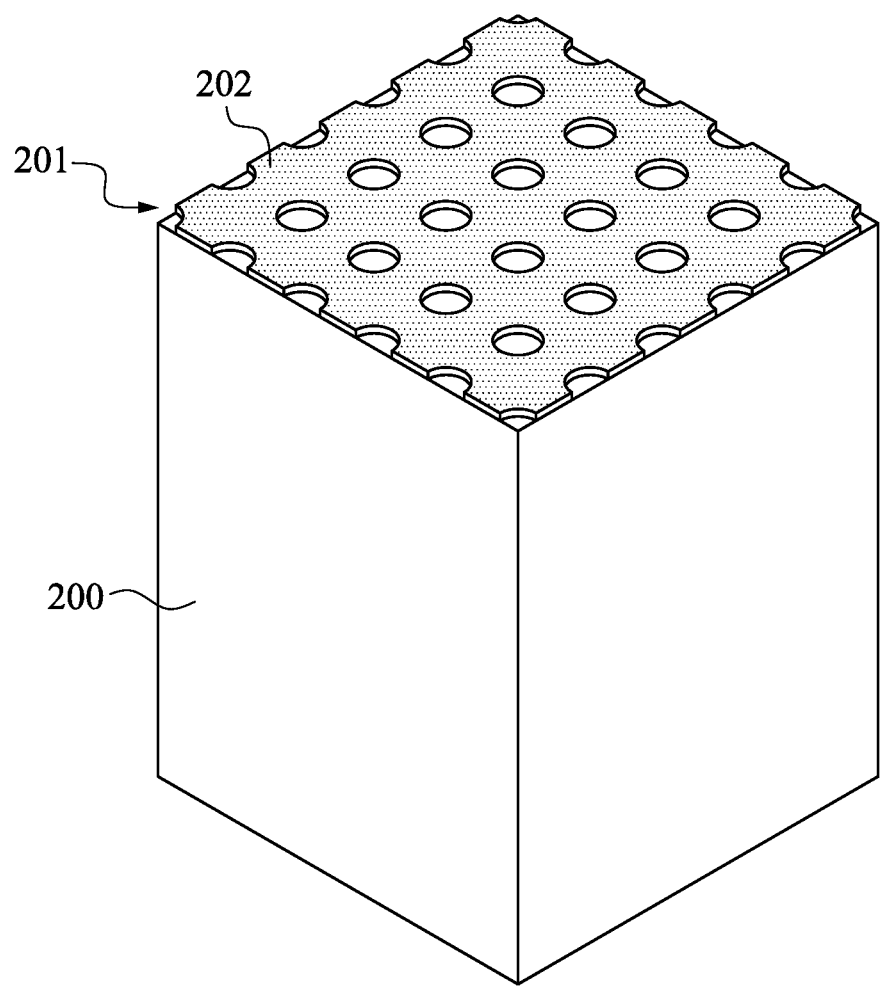
FIG. 9 is a perspective view of a portion of a semiconductor structure in an intermediate stage of fabrication in accordance with another embodiment of the present disclosure.
Figure 10:
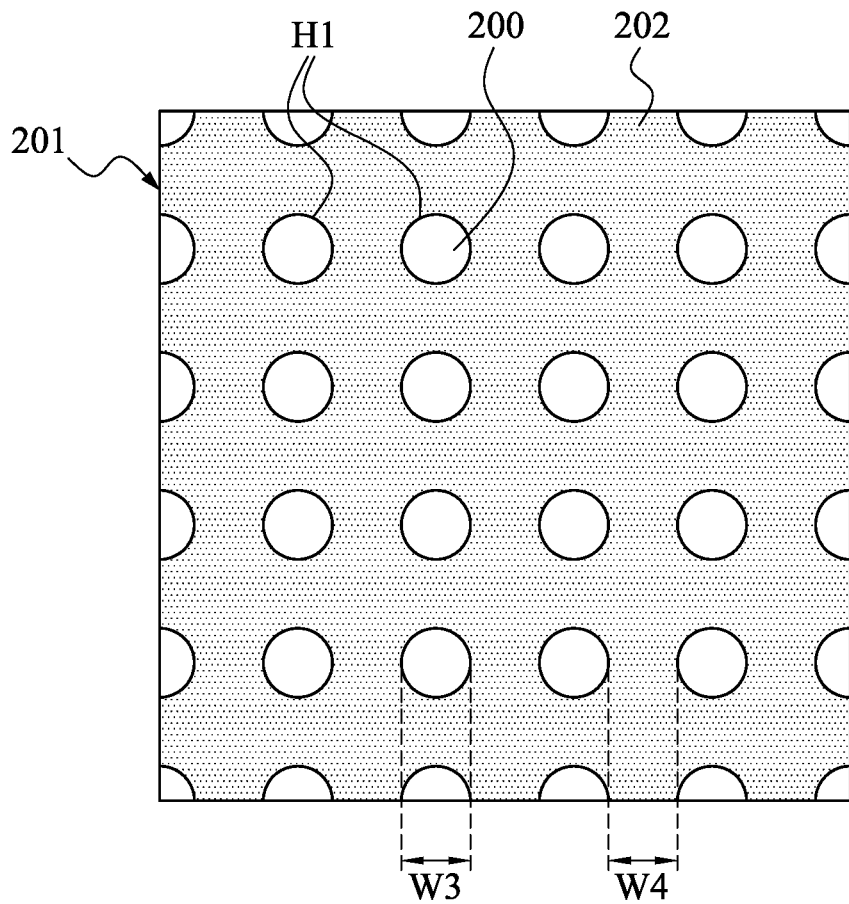
FIG. 10 is a top view of a portion of a semiconductor structure in an intermediate stage of fabrication in accordance with some embodiments of the present disclosure.

FIG. 9 is a perspective view of a semiconductor structure at various stages in accordance with some embodiments of the present disclosure. FIG. 10 is a top view of FIG. 9 in accordance with some embodiments of the present disclosure. As illustrated, silicon substrate 100 is provided. In some embodiments, the silicon substrate 100 is a (100)

substrate having a (100) surface orientation, although it may have other surface orientations, such as (110). The silicon substrate 100 may be a bulk substrate, as shown in FIG. 1, or may be a silicon-on-insulator substrate having buried oxide (not shown). In some embodiments, the silicon substrate 100 is in a semiconductor chip or a portion of a wafer.

As shown in FIGS. 9 and 10. A mask layer 201 is formed on the silicon substrate 200 and patterned into to a patterned mask 202 having holes H1 through which the substrate 200 is exposed. The mask layer 201 is formed of a dielectric material, as discussed previously with regard to FIGS. 1 and 2.

In some embodiments, the holes H1 in patterned mask 202 have a repeated pattern. The holes H1 exposing the substrate 200 are arranged in rows and columns. The pattern of periodical holes H1 advantageously defines the boundaries of the subsequently formed recesses, and hence the sizes and the pattern densities of the recesses are more uniform. As shown in FIG. 10, the holes H1 are non-staggered. In some other embodiments, the holes are staggered. In some embodiments, the holes H1 are equally spaced. In some embodiments, the holes H1 are circular holes, and a diameter W3 of the hole H1 is substantially equal to a spacing W4 between the holes H1. The diameter W3 of the circular hole H1 may determine a depth of the subsequently formed recesses and hence the diameter W1 of the circular hole H1 may be controlled, for example, from about 10 nm to about 100 nm. In some embodiments, the diameter W3 of the hole H1 may be less than about 500 nm. If the diameter W3 of the hole H1 is greater than about 500 nm, the subsequently formed recesses may have a large topography which may be undesirable for the subsequent epitaxy process. In other embodiments, the diameter W3 of the hole H1 is in a range from about 5 nm to about 15 nm. It is realized, however, that the dimensions recited throughout the description are merely examples, and different dimensions may also be used. Moreover, the circular shape of the holes H1 are merely examples as well, and in other embodiments, the shape of the holes may include, but not limited to, square, rectangular or oval.

Figure 11:
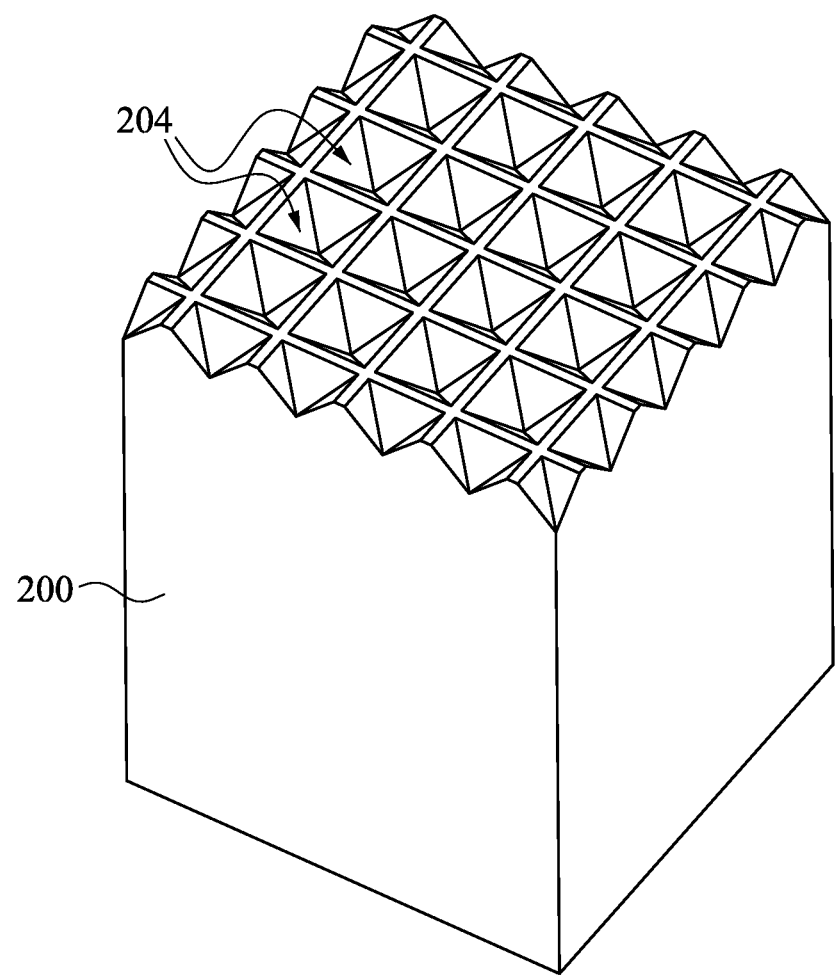
FIG. 11 is a perspective view of a portion of a semiconductor structure in an intermediate stage of fabrication in accordance with some embodiments of the present disclosure.
Figure 12:
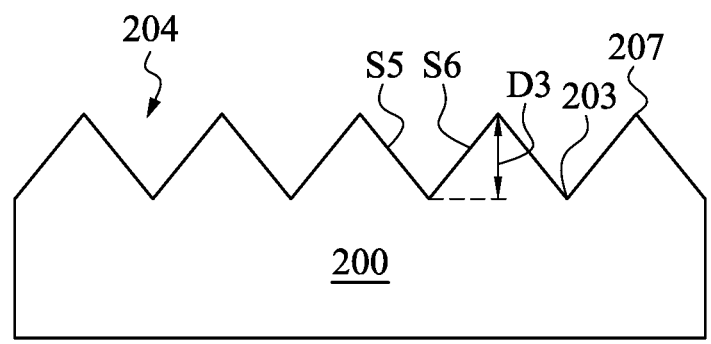
FIG. 12 is a cross-sectional view of a portion of a semiconductor structure in an intermediate stage of fabrication in accordance with some embodiments of the present disclosure.

Next, portions of the silicon substrate 200 are etched to form recesses 204 using the patterned mask layer 201 as an etch mask. In some embodiments, the etching process also removes the patterned mask layer 201 if the patterned mask layer 201 is made of silicon oxide. In some other embodiments, an additional etching process is used to remove the patterned mask layer 201. The resulting structure is shown in FIGS. 11 and 12, wherein FIG. 11 is a perspective view, while FIG. 12 is a cross-sectional view. In some embodiments, the etching of the substrate 200 may be, for example, anisotropic wet etching.

The anisotropic wet etching may use a potassium hydroxide (KOH)-based solution, a tetramethylammonium hydroxide (TMAH)-based solution, the like, or combinations thereof. Potassium hydroxide (KOH) and tetramethylammonium hydroxide (TMAH) display a higher rate in the (100) and (110) planes than in the (111) plane. For example, the etch rate ratio of (100) plane:(110) plane:(111) plane may satisfy: 1:0.5:0.01 in TMAH. Therefore, the recess 204 formed by the anisotropic wet etching has a substantially inverted pyramidal shape, as shown in FIG. 11. The recesses 204 may have V-shaped cross-sectional profile, as shown in FIG. 12. The sidewalls S5 and S6 of the recess 204 have a (111) crystal orientation. In some embodiments, the recess 204 has a depth D3 of from about 50 nm to about 300 nm, for example, about 250 nm to about 275 nm, such as 265 nm. In other words, the recess 204 has a depth from an apex (or peak) 207 to a valley 203 of the recess 204.

In some embodiments, the recesses 204 may be formed using potassium hydroxide (KOH) having from about 20% to about 40% volume percentage of KOH dissolved in water and in a temperature range from about 60° C. to about 80° C. In other embodiments, the recesses 204 may be formed using potassium hydroxide (KOH) having from about 40% to about 50% volume percentage of KOH dissolved in water and in a temperature range from about 110° C. to about 130° C.

Figure 13:
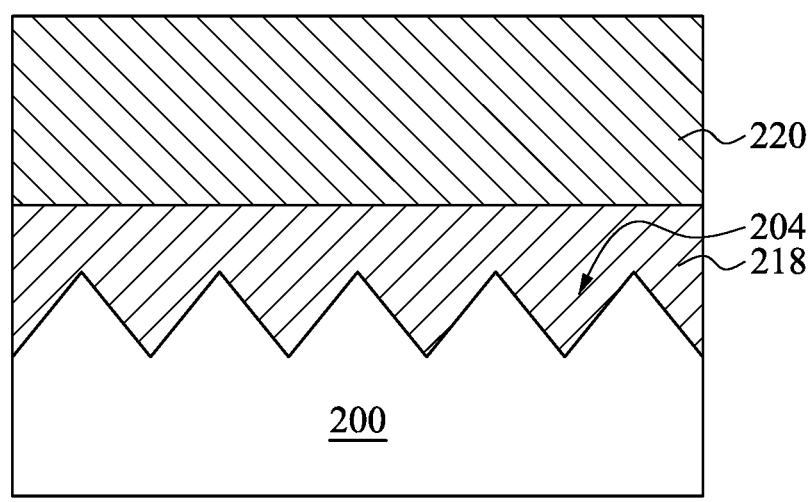
FIG. 13 is a cross-sectional view of a portion of a semiconductor structure in an intermediate stage of fabrication in accordance with some embodiments of the present disclosure.

Reference is made to FIG. 13. A first epitaxial layer 218 is formed at least in the recesses 204, and a second epitaxial layer 220 is formed on the first epitaxial layer 218. The first epitaxial layer 218 and/or the second epitaxial layer 220 are made of a material or materials which have lattice mismatches to the substrate 200. In some embodiments, the first epitaxial layer 218 and/or the second epitaxial layer 220 are made of germanium. The lattice mismatch between germanium and silicon is about 4%. In other embodiments, the first epitaxial layer 218 and/or the second epitaxial layer 220 are made of an III-V compound or III-V compounds. The lattice mismatch between an III-V compound and silicon is in a range from about 8% to about 12%. Therefore, if the recesses 204 were absent from the substrate 200, the first epitaxial layer 218 and/or the second epitaxial layer 220 might have epitaxial defects due to the lattice mismatch between the first epitaxial layer 218 and the substrate 200. The epitaxial defects may be, for example, threading dislocations (TDs).

Since the first epitaxial layer 218 is formed in the recesses 204, the threading dislocations (TDs) in the first epitaxial layer 118 terminate at sidewalls of the recesses 204. That is to say, the recesses 204 can terminate the TDs in the first epitaxial layer 218. In other words, the TDs extending along different directions can be trapped in the recesses 204. The first and second epitaxial layer 218 and 220 may be formed by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHVCVD), molecular beam epitaxy (MBE), or atomic layer deposition (ALD). In some embodiments, chemical-mechanical polishing (CMP) may be used to planarize a top surface of the second epitaxial layer 220. The second epitaxial layer 220 may be used for subsequent device fabrication.

Figure 14:
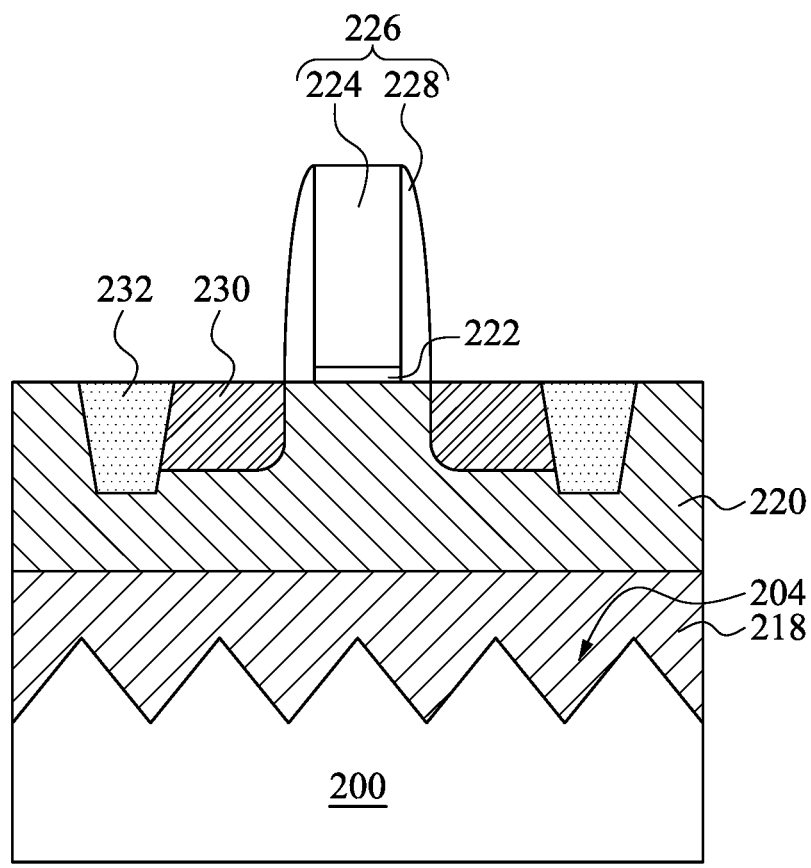
FIG. 14 is a cross-sectional view of a portion of a semiconductor structure in an intermediate stage of fabrication in accordance with some embodiments of the present disclosure.

FIG. 14 illustrates an exemplary transistor formed on the second epitaxial layer 220. With reference to FIG. 14. At least one gate structure 226 is formed on the substrate 200. In some embodiments, at least one of the gate structures 226 includes a gate dielectric layer 222 and a gate electrode layer 224, in which the gate electrode layer 224 is formed over the gate dielectric layer 222.

In some embodiments, the gate dielectric layer 222 includes a silicon oxide, silicon oxynitride, or high-k dielectric material. A high-k dielectric material is defined as a dielectric material with a dielectric constant greater than that of $SiO_2$, and the high-k dielectric material includes metal oxide. In some embodiments, the metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. In some embodiments, the gate dielectric layer 222 is grown by using a suitable process, such as a chemical vapor deposition (CVD) process or an atomic layer deposition (ALD) process. In some embodiments, the gate dielectric layer 222 further includes an interfacial layer (not illustrated) to minimize stress between the gate dielectric layer 222 and the substrate 200.

In some embodiments, the interfacial layer is formed of silicon oxide or silicon oxynitride grown by a thermal oxidation process. For example, the interfacial layer can be grown by a rapid thermal oxidation (RTO) process or in an annealing process comprising oxygen.

In some embodiments, the gate electrode layer 224 includes a single layer or multilayer structure. In some embodiments, the gate electrode layer 224 includes poly-silicon. Furthermore, the gate electrode layer 224 may be doped poly-silicon with the uniform or gradient doping. In some embodiments, the gate electrode layer 224 is formed by using a low-pressure CVD (LPCVD) process. In some other embodiments, the gate electrode layer 224 is a metal gate.

In some embodiments, at least one pair of spacers 228 is formed to be adjacent to sidewalls of at least one of the gate structure 226, in which the spacers 228 are formed of silicon oxide, silicon nitride, silicon oxynitride, silicon carbide, fluoride-doped silicate glass (FSG), a low k dielectric material, and/or combinations thereof. In some embodiments, at least one of the spacers 228 may have a multiple-layers structure, for example, including one or more liner layers.

In some embodiments, source/drain (S/D) regions 230 are created in the active region of the substrate 200. In some embodiments, the S/D regions 230 in the substrate 200 are laterally spaced from sides of at least one of the gate structure 226 (i.e. adjacent the regions of the substrate 200 underlying the gate structures 226). In some embodiments, the S/D regions 230 are formed by using an ion implantation. For example, an n-type dopant, such as phosphorous, or a p-type dopant, such as boron is doped into at least one portion of the substrate 200 which is not covered by the spacers 228 and the gate structures 226, so as to form the S/D regions 230.

In some embodiments, at least one the isolation region 232 is formed in the substrate 200 to isolate the various active regions of the substrate 200. The isolation regions 232 may utilize isolation technology, such as local oxidation of silicon (LOCOS) or shallow trench isolation (STI) region, to define and electrically isolate the various active regions of the substrate 200. In some embodiments, at least one of the isolation regions 232 serves as a STI region. The isolation regions 232 include silicon oxide, silicon nitride, silicon oxynitride, fluoride-doped silicate glass (FSG), a low-K dielectric material, other suitable materials, or combinations thereof.

Further processes are performed to form various features such as additional interlayer dielectric layers, contacts/vias, interconnect metal layers, and passivation layers, etc. In the foregoing embodiments, planar type FET is employed. It is also noted that the present disclosure may be employed in various transistors. For example, embodiments of the present disclosure may be used to form multi-gate transistors such as FinFET devices, gate-all-around (GAA) devices, Omega-gate (a-gate) devices, or Pi-gate (H-gate) devices, as well as strained-semiconductor devices, silicon-on-insulator (SOI) devices, partially-depleted SOI devices, fully-depleted SOI devices. In addition, embodiments disclosed herein may be employed in the formation of P-type and/or N-type devices. One of ordinary skill may recognize other embodiments of semiconductor devices that may benefit from aspects of the present disclosure.

Figure 15:
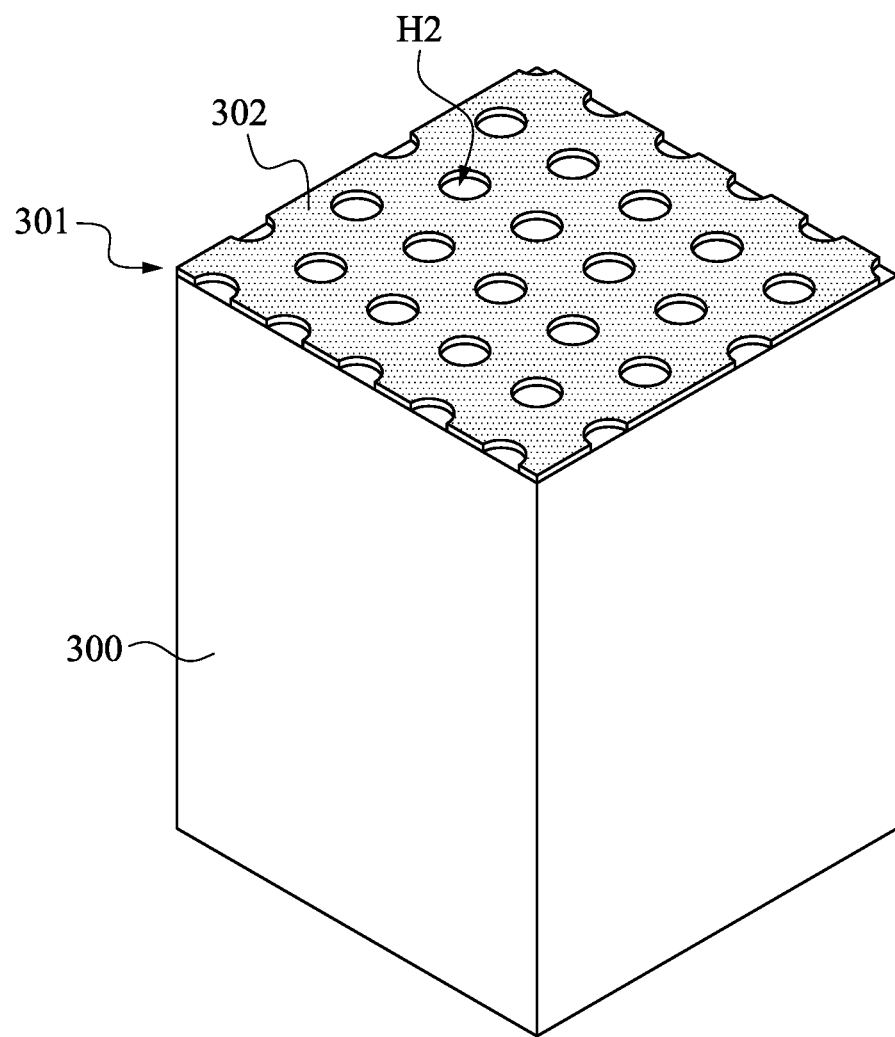
FIG. 15 is a perspective view of a portion of a semiconductor structure in an intermediate stage of fabrication in accordance with some embodiments of the present disclosure.
Figure 16:
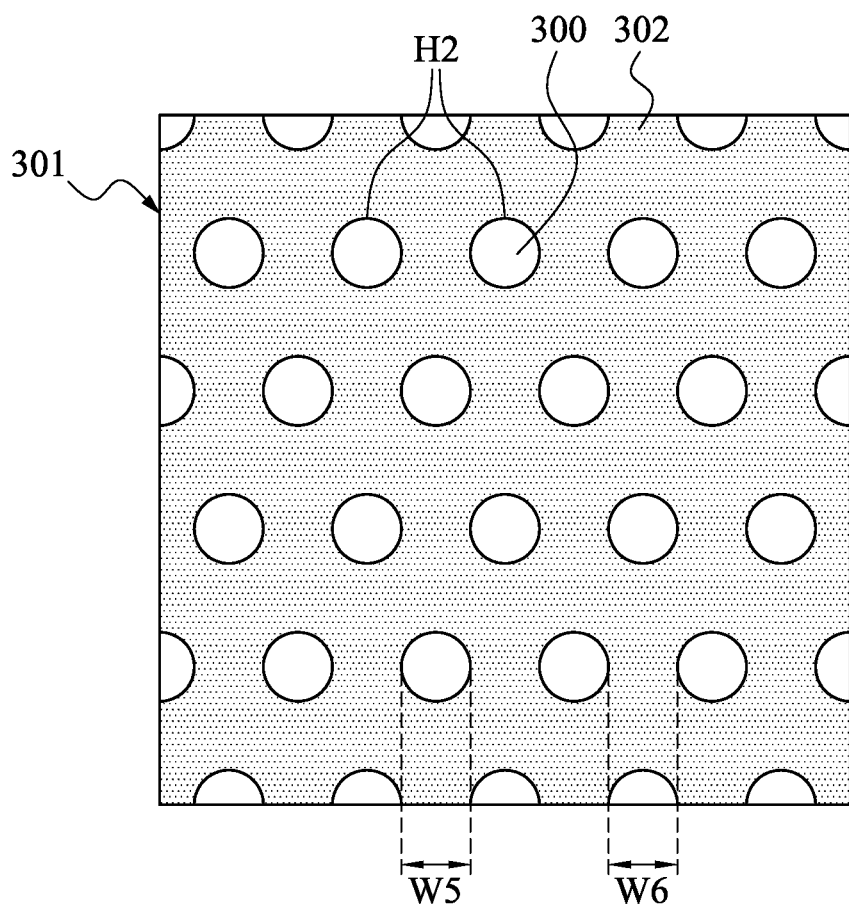
FIG. 16 is a top view of a portion of a semiconductor structure in an intermediate stage of fabrication in accordance with some embodiments of the present disclosure.

FIG. 15 is a perspective view of a semiconductor structure at various stages in accordance with some embodiments of the present disclosure. FIG. 16 is a top view of FIG. 15 in accordance with some embodiments of the present disclosure. As illustrated, silicon substrate 100 is provided. In some embodiments, the silicon substrate 100 is a (100) substrate having a (100) surface orientation, although it may have other surface orientations, such as (110). The silicon substrate 100 may be a bulk substrate, as shown in FIG. 15, or may be a silicon-on-insulator substrate having buried oxide (not shown). In some embodiments, the silicon substrate 100 is in a semiconductor chip or a portion of a wafer.

As shown in FIGS. 15 and 16. A mask layer 301 is formed on the silicon substrate 300 and patterned into to a patterned mask 302 having holes H2 through which the substrate 300 is exposed. The mask layer 301 is formed of a dielectric material, as discussed previously with regard to FIGS. 1 and 2.

In some embodiments, the holes H2 in patterned mask 302 have a staggered pattern. The holes H2 exposing the substrate 300 are arranged in rows and columns. The pattern of the holes H2 advantageously defines the boundaries of the subsequently formed recesses, and hence the sizes and the pattern densities of the recesses are more uniform. In some embodiments, the holes H2 are equally spaced. In some embodiments, the holes H2 are circular holes, and a diameter W5 of the hole H2 is substantially equal to a spacing W6 between the holes H2. The diameter of the hole H2 may determine a depth of the subsequently formed recesses and hence the diameter of the hole H2 may be controlled, for example, from about 10 nm to about 100 nm. In some embodiments, the diameter W5 of the hole H2 may be less than about 500 nm. If the diameter W5 of the hole H2 is greater than about 500 nm, the subsequently formed recesses may have a large topography which may be undesirable for the subsequent epitaxy process. In other embodiments, a diameter W5 of the hole H2 is in a range from about 5 nm to about 15 nm. It is realized, however, that the dimensions recited throughout the description are merely examples, and different dimensions may also be used. Moreover, the circular shape of the holes H2 are merely examples as well, and in other embodiments, the shape of the holes may include, but not limited to, square, rectangular or oval.

Figure 17:
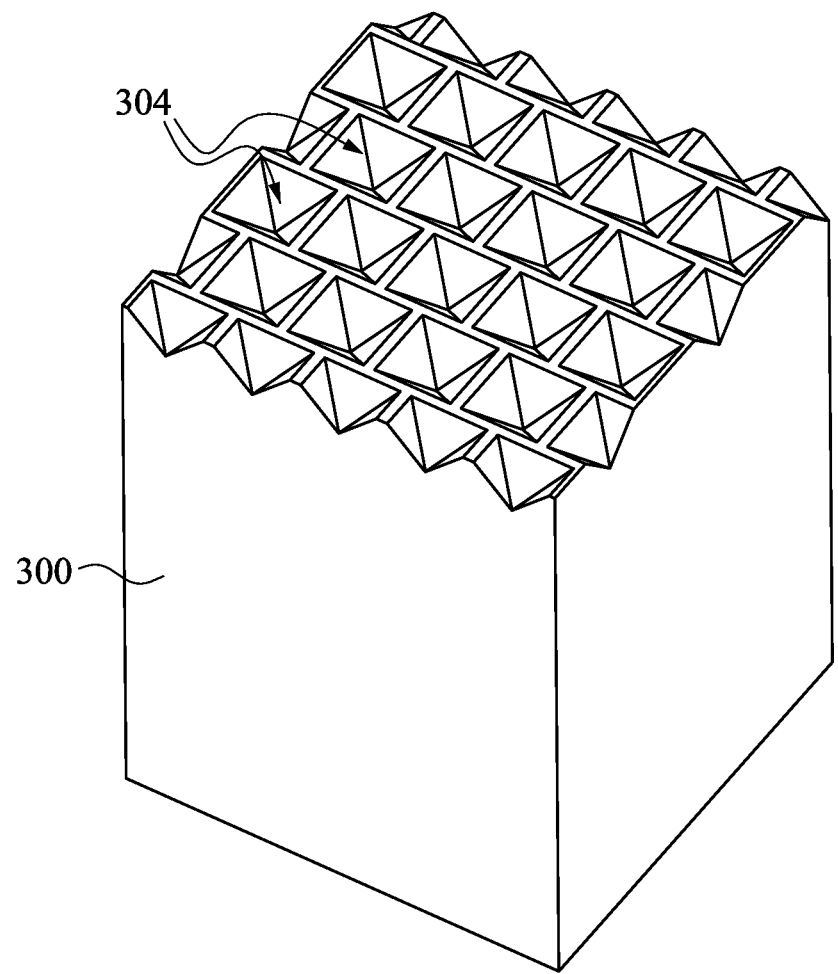
FIG. 17 is a perspective view of a portion of a semiconductor structure in an intermediate stage of fabrication in accordance with some embodiments of the present disclosure.
Figure 18:
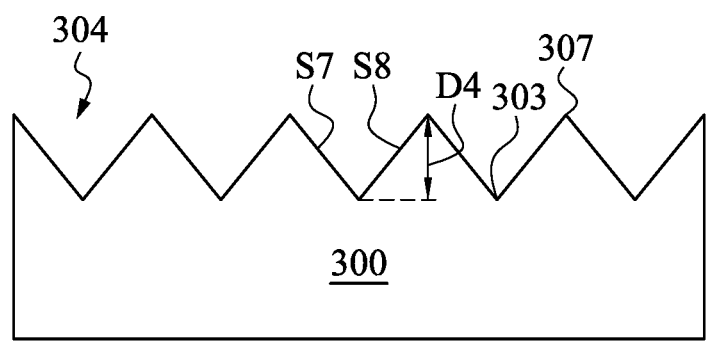
FIG. 18 is a cross-sectional view of a portion of a semiconductor structure in an intermediate stage of fabrication in accordance with some embodiments of the present disclosure.

Next, portions of the silicon substrate 300 are etched to form the recesses 304 using the patterned mask layer 301 as an etch mask. In some embodiments, the etching process also removes the patterned mask layer 301 if the patterned mask layer 301 is made of silicon oxide. In some embodiments, an additional etching process is used to remove the patterned mask layer 301. The resulting structure is shown in FIGS. 17 and 18, wherein FIG. 17 is a perspective view, while FIG. 18 is a cross-sectional view. In some embodiments, the etching of the substrate 300 may be, for example, anisotropic wet etching.

The anisotropic wet etching may use a potassium hydroxide (KOH)-based solution, a tetramethylammonium hydroxide (TMAH)-based solution, the like, or combinations thereof. Potassium hydroxide (KOH) and tetramethylammonium hydroxide (TMAH) display a higher rate in the (100) and (110) planes in the (111) plane. For example, the etch rate ratio of (100) plane:(110) plane:(111) plane may satisfy: 1:0.5:0.01 in TMAH. Therefore, the recess 304 formed by the anisotropic wet etching has a substantially inverted pyramidal shape, as shown in FIG. 17. The recesses 304 may have V-shaped cross sectional profile, as shown in FIG. 18. The sidewalls S7 and S8 of the recess 304 have a (111) crystal orientation. In some embodiments, the recess 304 has a depth D4 of from about 50 nm to about 300 nm, for example, about 240 nm to about 260 nm, such as 250 nm. In other words, the recess 304 has a depth from an apex (or peak) 307 to a valley 303 of the recess 304.

In some embodiments, the recesses 304 may be formed using potassium hydroxide (KOH) having from about 20% to about 40% volume percentage of KOH dissolved in water and in a temperature range from about 60° C. to about 80° C. In other embodiments, the recesses 304 may be formed using potassium hydroxide (KOH) having from about 40% to about 50% volume percentage of KOH dissolved in water and in a temperature range from about 110° C. to about 130° C.

Figure 19:
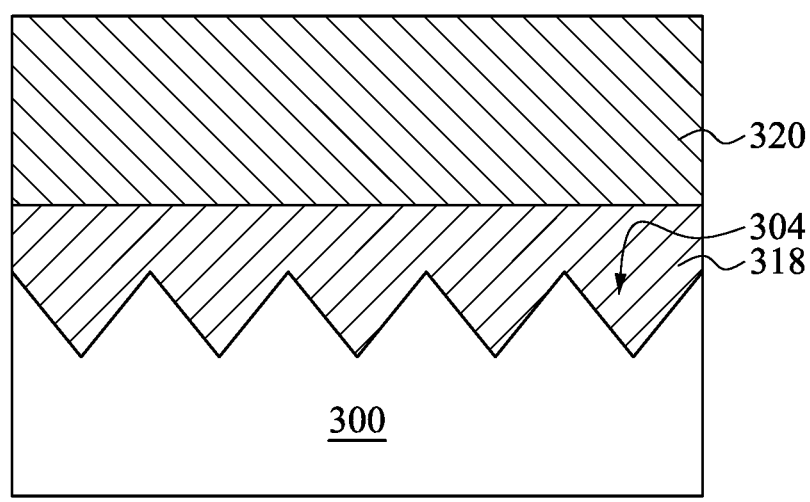
FIG. 19 is a cross-sectional view of a portion of a semiconductor structure in an intermediate stage of fabrication in accordance with some embodiments of the present disclosure.

Reference is made to FIG. 19. A first epitaxial layer 318 is formed at least in the recesses 304, and a second epitaxial layer 320 is formed on the first epitaxial layer 318. The first epitaxial layer 318 and/or the second epitaxial layer 320 are made of a material or materials which have lattice mismatches to the substrate 300. In some embodiments, the first epitaxial layer 318 and/or the second epitaxial layer 320 are made of germanium. The lattice mismatch between germanium and silicon is about 4%. In other embodiments, the first epitaxial layer 318 and/or the second epitaxial layer 320 are made of an III-V compound or III-V compounds. The lattice mismatch between an III-V compound and silicon is in a range from about 8% to about 12%. Therefore, if the recesses 304 were absent from the substrate 300, the first epitaxial layer 318 and/or the second epitaxial layer 320 might have epitaxial defects due to the lattice mismatch between the first epitaxial layer 318 and the substrate 200. The epitaxial defects may be, for example, threading dislocations (TDs).

Since the first epitaxial layer 318 is formed in the recesses 304, the threading dislocations (TDs) in the first epitaxial layer 318 terminate at sidewalls of the recesses 304. That is to say, the recesses 304 can terminate the TDs in the first epitaxial layer 318. In other words, the TDs extending along different directions can be trapped in the recesses 304. The first and second epitaxial layer 318 and 320 may be formed by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHVCVD), molecular beam epitaxy (MBE), or atomic layer deposition (ALD). In some embodiments, chemical-mechanical polishing (CMP) may be used to planarize a top surface of the second epitaxial layer 320. The second epitaxial layer 320 may be used for subsequent device fabrication.

Figure 20:
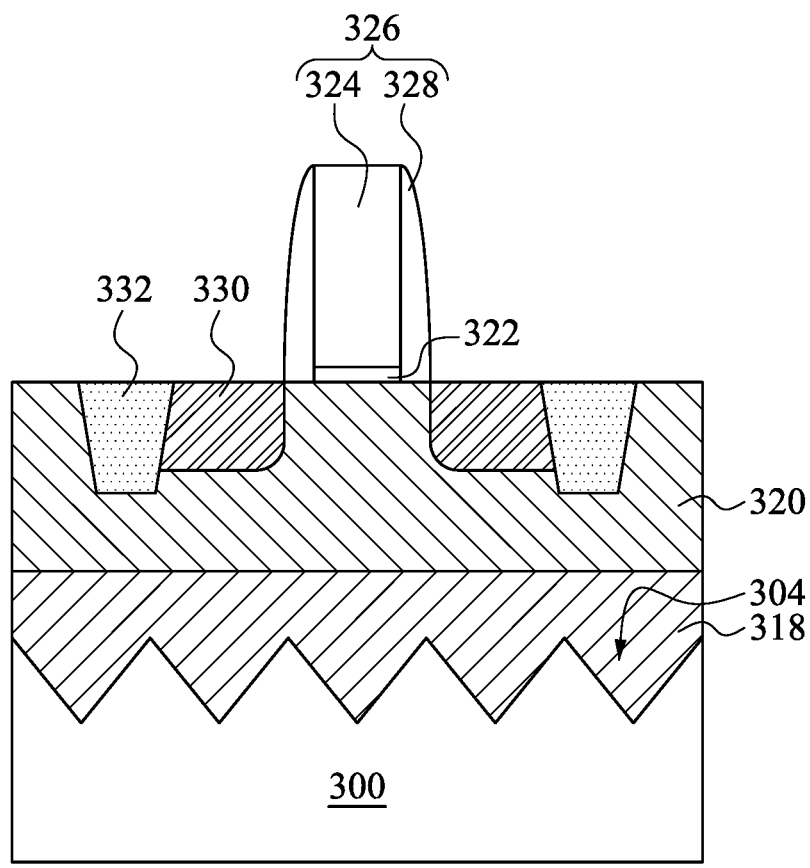
FIG. 20 is a cross-sectional view of a portion of a semiconductor structure in an intermediate stage of fabrication in accordance with some embodiments of the present disclosure.

FIG. 20 illustrates an exemplary transistor formed on the second epitaxial layer 320. With reference to FIG. 20. At least one gate structure 326 is formed on the substrate 300. In some embodiments, at least one of the gate structures 326 includes a gate dielectric layer 322 and a gate electrode layer 324, in which the gate electrode layer 324 is formed over the gate dielectric layer 322.

In some embodiments, the gate dielectric layer 322 includes a silicon oxide, silicon oxynitride, or high-k dielectric material. A high-k dielectric material is defined as a dielectric material with a dielectric constant greater than that of $SiO_2$, and the high-k dielectric material includes metal oxide. In some embodiments, the metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. In some embodiments, the gate dielectric layer 322 is grown by using a suitable process, such as a chemical vapor deposition (CVD) process or an atomic layer deposition (ALD) process. In some embodiments, the gate dielectric layer 322 further includes an interfacial layer (not illustrated) to minimize stress between the gate dielectric layer 322 and the substrate 300.

In some embodiments, the interfacial layer is formed of silicon oxide or silicon oxynitride grown by a thermal oxidation process. For example, the interfacial layer can be grown by a rapid thermal oxidation (RTO) process or in an annealing process comprising oxygen.

In some embodiments, the gate electrode layer 324 includes a single layer or multilayer structure. In some embodiments, the gate electrode layer 324 includes poly-silicon. Furthermore, the gate electrode layer 324 may be doped poly-silicon with the uniform or gradient doping. In some embodiments, the gate electrode layer 324 is formed by using a low-pressure CVD (LPCVD) process. In some other embodiments, the gate electrode layer 324 is a metal gate.

In some embodiments, at least one pair of spacers 328 is formed to be adjacent to sidewalls of at least one of the gate structure 326, in which the spacers 328 are formed of silicon oxide, silicon nitride, silicon oxynitride, silicon carbide, fluoride-doped silicate glass (FSG), a low k dielectric material, and/or combinations thereof. In some embodiments, at least one of the spacers 328 may have a multiple-layers structure, for example, including one or more liner layers.

In some embodiments, source/drain (S/D) regions 330 are created in the active region of the substrate 300. In some embodiments, the S/D regions 330 in the substrate 300 are laterally spaced from sides of at least one of the gate structure 326 (i.e. adjacent the regions of the substrate 300 underlying the gate structures 326). In some embodiments, the S/D regions 330 are formed by using an ion implantation. For example, an n-type dopant, such as phosphorous, or a p-type dopant, such as boron is doped into at least one portion of the substrate 300 which is not covered by the spacers 328 and the gate structures 326, so as to form the S/D regions 330.

In some embodiments, at least one the isolation region 332 is formed in the substrate 300 to isolate the various active regions of the substrate 100. The isolation regions 332 may utilize isolation technology, such as local oxidation of silicon (LOCOS) or shallow trench isolation (STI) region, to define and electrically isolate the various active regions of the substrate 300. In some embodiments, at least one of the isolation regions 332 serves as a STI region. The isolation regions 332 include silicon oxide, silicon nitride, silicon oxynitride, fluoride-doped silicate glass (FSG), a low-K dielectric material, other suitable materials, or combinations thereof.

Further processes are performed to form various features such as additional interlayer dielectric layers, contacts/vias, interconnect metal layers, and passivation layers, etc. In the foregoing embodiments, planar type FET is employed. It is also noted that the present disclosure may be employed in various transistors. For example, embodiments of the present disclosure may be used to form multi-gate transistors such as FinFET devices, gate-all-around (GAA) devices, Omega-gate (a-gate) devices, or Pi-gate (H-gate) devices, as well as strained-semiconductor devices, silicon-on-insulator (SOI) devices, partially-depleted SOI devices, fully-depleted SOI devices. In addition, embodiments disclosed herein may be employed in the formation of P-type and/or N-type devices. One of ordinary skill may recognize other embodiments of semiconductor devices that may benefit from aspects of the present disclosure.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that defect-free heterogeneous epitaxial layers on (001) silicon wafers may be provided because defects can be trapped in the recesses having (111) sidewalls in the silicon wafer. Another advantage is that a thickness requirement of the subsequently formed epitaxial layer over the silicon wafer, which acts as the strain-relax buffer, is decreased because defects are trapped in the recesses.

In some embodiments, a method of manufacturing a semiconductor structure comprises etching a semiconductor substrate having a top surface extending along a (001) crystal plane, such that a majority of a top surface of the etched semiconductor substrate extends along {111} crystal planes; forming a first epitaxial layer in contact with the top surface of the etched semiconductor substrate; and forming a second epitaxial layer on the first epitaxial layer.

In some embodiments, the method further comprises forming a mask layer on the semiconductor substrate; and patterning the mask layer to form a plurality of dot-shaped mask portions arranged on the semiconductor substrate in a spaced apart manner, wherein etching the semiconductor substrate is performed after patterning the mask layer.

In some embodiments, etching the semiconductor substrate is performed such that the patterned mask layer is removed.

In some embodiments, one of the dot-shaped mask portions has a diameter substantially equal to a spacing between the dot-shaped mask portions.

In some embodiments, the dot-shaped mask portions have substantially equal size.

In some embodiments, the method further comprises forming a mask layer on the semiconductor substrate; and etching a plurality of circular holes in the mask layer to expose the semiconductor substrate, wherein etching the semiconductor substrate is performed after etching the circular holes.

In some embodiments, the circular holes are arranged in a staggered pattern.

In some embodiments, the circular holes are arranged in non-staggered pattern.

In some embodiments, etching the semiconductor substrate is performed using at least one of potassium hydroxide (KOH) and tetramethyl-ammonium-hydroxide (TMAH).

In some embodiments, a method of manufacturing a semiconductor structure comprises forming a plurality of recesses in a semiconductor substrate, wherein the recesses are immediately adjacent to each other, and a sidewall of one of the recesses extends along a {111} crystal plane; forming a first epitaxial layer in the recesses; and forming a second epitaxial layer on the first epitaxial layer.

In some embodiments, the method further comprises forming a mask layer on the semiconductor substrate; and etching the mask layer to form a plurality of dots arranged in rows and columns, wherein the recesses are formed after etching the mask layer.

In some embodiments, forming the recesses comprises etching the semiconductor substrate, and an etchant used in the etching the semiconductor substrate has a higher etch rate in a (100) crystal plane than in a (111) crystal plane.

In some embodiments, forming the recesses comprises etching the semiconductor substrate, and an etchant used in the etching the semiconductor substrate has a higher etch rate in a (110) crystal plane than in a (111) crystal plane.

In some embodiments, forming the recesses is performed such that at least one of the recesses has a V-shaped profile.

In some embodiments, the sidewall of the recess shares the same edge with a sidewall of another of the recesses.

In some embodiments, the method further comprises forming a transistor on the second epitaxial layer and over the recesses.

In some embodiments, a semiconductor structure comprises a substrate having a plurality of silicon pyramids arranged in rows and columns; a first epitaxial layer in contact with sidewalls of the silicon pyramids; a second epitaxial layer over the first epitaxial layer; and an isolation region embedded in the second epitaxial layer.

In some embodiments, neighboring two of the silicon pyramids share the same edge.

In some embodiments, one of the silicon pyramids has a sidewall extending along a {111} crystal plane.

In some embodiments, the first epitaxial layer is lattice mismatched to the silicon pyramids.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate comprising a first pyramid protrusion, a second pyramid protrusion, a third pyramid protrusion, and a fourth pyramid protrusion, wherein the first and second pyramid protrusions are arranged along a first direction, the second and fourth pyramid protrusions are arranged along the first direction, and the first and third pyramid protrusions are arranged along a second direction crossing the first direction, wherein a top surface of the first pyramid protrusion has a (100) crystal orientation;
a first epitaxial layer over the substrate and in contact with the first, second, third, and fourth pyramid protrusions, wherein the first epitaxial layer is a single piece of continuous material;
a second epitaxial layer over the first epitaxial layer, wherein the second epitaxial layer is a single piece of continuous material, and the first epitaxial layer is in contact with the substrate and the second epitaxial layer; and
a transistor over and partially embedded in the second epitaxial layer.

2. The semiconductor structure of claim 1, further comprising an isolation structure embedded in the second epitaxial layer.

3. The semiconductor structure of claim 2, wherein the isolation structure is spaced apart from the first epitaxial layer.

4. The semiconductor structure of claim 1, wherein each of the first, second, third, and fourth pyramid protrusions has four (111) sidewalls.

5. The semiconductor structure of claim 1, wherein each of the first, second, third, and fourth pyramid protrusions has a height in a range of about 5 nm to about 80 nm.

6. The semiconductor structure of claim 1, wherein a top surface of the first epitaxial layer is flatter than a bottom surface of the first epitaxial layer.

7. The semiconductor structure of claim 1, wherein a sidewall of the first pyramid protrusion and a sidewall of the second pyramid protrusion share an edge.

8. The semiconductor structure of claim 1, wherein a sidewall of the first pyramid protrusion and a sidewall of the third pyramid protrusion share an edge.

9. The semiconductor structure of claim 1, wherein a gate structure of the transistor is in contact with the second epitaxial layer.

10. A method comprising:
    forming a mask layer over a substrate;
    patterning the mask layer to expose portions of the substrate;
    etching the substrate by using the patterned mask layer as an etch mask to form a plurality of pyramid protrusions at a top surface of the substrate, wherein a top surface of one of the plurality of pyramid protrusions has a (100) crystal orientation;
    removing the patterned mask layer;
    forming a first epitaxial layer over and in contact with the plurality of pyramid protrusions of the substrate, wherein the first epitaxial layer is a single piece of continuous material;
    forming a second epitaxial layer over the first epitaxial layer, wherein the second epitaxial layer is a single piece of continuous material, and the first epitaxial layer is in contact with the substrate and the second epitaxial layer; and
    forming a transistor over and partially embedded in the second epitaxial layer.

11. The method of claim 10, wherein patterning the mask layer comprises forming a plurality of dots arranged in rows and columns, and a diameter of each of the dots of the mask layer is substantially equal to a minimum distance directly between adjacent two of the dots of the mask layer.

12. The method of claim 10, wherein an etchant used in the etching the substrate has a higher etch rate in a (100) crystal plane than in a (111) crystal plane.

13. The method of claim 10, wherein an etchant used in the etching the substrate has a higher etch rate in a (110) crystal plane than in a (111) crystal plane.

14. The method of claim 10, wherein the transistor is over the plurality of pyramid protrusions of the substrate.

15. A method comprising:
    forming a mask layer over a substrate;
    forming a plurality of holes in the mask layer to expose the substrate, wherein a diameter of each of the holes is less than about 100 nm, and the diameter of each of the holes of the mask layer is substantially equal to a minimum width of a portion of the mask layer directly between adjacent two of the holes of the mask layer;
    etching the substrate by using the mask layer as an etch mask such that a plurality of recesses are formed in the substrate;
    forming a first epitaxial layer over the substrate and filling the recesses; and
    forming a second epitaxial layer over the first epitaxial layer.

16. The method of claim 15, wherein etching the substrate is performed such that the mask layer is removed.

17. The method of claim 15, wherein the holes of the mask layer have substantially equal size.

18. The method of claim 15, wherein etching the substrate is performed using at least one of potassium hydroxide (KOH) and tetramethyl-ammonium-hydroxide (TMAH).

19. The method of claim 15, wherein the first epitaxial layer is lattice mismatched to the substrate.

20. The method of claim 15, wherein the holes of the mask layer are arranged to form a first row and a second row in a top view, and the holes in the first row are offset from the holes in the second row.

* * * * *